(12) United States Patent
Kubo et al.

(10) Patent No.: US 10,403,814 B2
(45) Date of Patent: Sep. 3, 2019

(54) METHOD OF CLEANING AND METHOD OF PLASMA PROCESSING

(71) Applicant: Tokyo Electron Limited, Tokyo (JP)

(72) Inventors: Takuya Kubo, Tokyo (JP); Song yun Kang, Tokyo (JP); Keiichi Shimoda, Beaverton, OR (US); Tetsuya Ohishi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/566,384

(22) PCT Filed: May 2, 2016

(86) PCT No.: PCT/JP2016/063605
§ 371 (c)(1),
(2) Date: Oct. 13, 2017

(87) PCT Pub. No.: WO2016/181893
PCT Pub. Date: Nov. 17, 2016

(65) Prior Publication Data
US 2018/0301622 A1    Oct. 18, 2018

(30) Foreign Application Priority Data

May 14, 2015    (JP) ................................. 2015-098867

(51) Int. Cl.
*B08B 5/00*    (2006.01)
*C23F 1/02*    (2006.01)
(Continued)

(52) U.S. Cl.
CPC ............ *H01L 43/12* (2013.01); *G11B 5/8404* (2013.01); *G11C 11/161* (2013.01);
(Continued)

(58) Field of Classification Search
CPC .. H01J 37/32862; H01J 37/32091; B08B 9/00
See application file for complete search history.

(56) References Cited

U.S. PATENT DOCUMENTS

2010/0055807 A1*  3/2010  Srivastava .............. G03F 7/427
                                                        438/9
2011/0169116 A1*  7/2011  Nanver ........... H01L 31/022408
                                                     257/429

(Continued)

FOREIGN PATENT DOCUMENTS

JP        2005-056547        3/2005

OTHER PUBLICATIONS

Morgan et al, "Removal of Carbon Contamination using Hydrogen with Low-Power Downstream Plasma Cleaning", Poster Presentation at SPIE Advanced Lithography Conference, Mar. 2011, San Jose, CA.*

*Primary Examiner* — Brian Turner
(74) *Attorney, Agent, or Firm* — IPUSA, PLLC

(57) ABSTRACT

A method of cleaning a substrate processing apparatus that etches a film including a metal, the method include a first cleaning step of providing a gas containing a hydrogen-containing gas, and removing a carbon-containing deposition by plasma generated from the gas containing the hydrogen-containing gas; a second cleaning step of, after the first cleaning step, providing an inert gas, and removing a metal-containing deposition by plasma generated from the inert gas; and a third cleaning step of, after the second cleaning step, providing a gas containing a fluorine-containing gas and an oxygen-containing gas, and removing a silicon-containing deposition by plasma generated from the gas containing the fluorine-containing gas and the oxygen-containing gas.

8 Claims, 12 Drawing Sheets

(51) Int. Cl.
<table>
<tr><td>H01J 37/32</td><td>(2006.01)</td></tr>
<tr><td>C23F 1/08</td><td>(2006.01)</td></tr>
<tr><td>H01L 43/12</td><td>(2006.01)</td></tr>
<tr><td>G11C 11/16</td><td>(2006.01)</td></tr>
<tr><td>H01F 10/32</td><td>(2006.01)</td></tr>
<tr><td>H01F 41/34</td><td>(2006.01)</td></tr>
<tr><td>H01L 21/67</td><td>(2006.01)</td></tr>
<tr><td>H01L 21/66</td><td>(2006.01)</td></tr>
<tr><td>H01L 27/22</td><td>(2006.01)</td></tr>
<tr><td>H01L 43/02</td><td>(2006.01)</td></tr>
<tr><td>G11B 5/84</td><td>(2006.01)</td></tr>
<tr><td>H01L 21/683</td><td>(2006.01)</td></tr>
<tr><td>H01L 43/10</td><td>(2006.01)</td></tr>
</table>

(52) U.S. Cl.
CPC ......... *H01F 10/3259* (2013.01); *H01F 41/34* (2013.01); *H01J 37/32091* (2013.01); *H01J 37/32724* (2013.01); *H01J 37/32853* (2013.01); *H01J 37/32963* (2013.01); *H01L 21/67028* (2013.01); *H01L 21/67069* (2013.01); *H01L 21/67109* (2013.01); *H01L 21/67253* (2013.01); *H01L 21/6831* (2013.01); *H01L 22/26* (2013.01); *H01L 27/222* (2013.01); *H01L 43/02* (2013.01); *H01F 10/3272* (2013.01); *H01J 37/32183* (2013.01); *H01J 37/32449* (2013.01); *H01J 2237/002* (2013.01); *H01J 2237/24507* (2013.01); *H01J 2237/327* (2013.01); *H01J 2237/334* (2013.01); *H01J 2237/335* (2013.01); *H01L 21/6833* (2013.01); *H01L 43/10* (2013.01)

(56) References Cited

U.S. PATENT DOCUMENTS

| | | | |
|---|---|---|---|
| 2013/0048606 A1* | 2/2013 | Mao | C23F 4/00 216/67 |
| 2014/0014965 A1* | 1/2014 | Kraus | H01L 21/0262 257/76 |
| 2014/0053866 A1* | 2/2014 | Baluja | C11D 11/0041 134/1.1 |

* cited by examiner

METHOD OF CLEANING AND METHOD OF PLASMA PROCESSING

BACKGROUND OF THE INVENTION

1. Field of the Invention

The present invention relates to a method of cleaning and a method of plasma processing.

2. Description of the Related Art

A method of manufacturing a magnetic recording medium or the like having good magnetic properties is disclosed in which a body to be processed including a magnetic material is processed using an oxidizing reaction gas, and then the oxidizing reaction gas is removed (see Patent Document 1, for example).

Patent Document

[Patent Document 1] Japanese Laid-open Patent Publication No. 2005-56547

When etching the body to be processed, different types of depositions may be generated such as a deposition containing a metal included in the body to be processed, a carbon-containing deposition, and a deposition containing silicon used as an underlayer film of the metal film, parts in a process chamber or the like. However, according to Patent Document 1, cleaning of the multiple different types of depositions is performed using a same gas. Thus, a part of the depositions may not be removed and remained in the process chamber. Such a residual material causes variation of an etching rate and generation of particles, and it is necessary to exchange parts often.

SUMMARY OF THE INVENTION

The present invention is made in light of the above problems, and provides a method of cleaning capable of effectively removing multiple types of depositions.

According to an embodiment, there is provided a method of cleaning a substrate processing apparatus that etches a film including a metal, the method including a first cleaning step of providing a gas containing a hydrogen-containing gas, and removing a carbon-containing deposition by plasma generated from the gas containing the hydrogen-containing gas; a second cleaning step of, after the first cleaning step, providing an inert gas, and removing a metal-containing deposition by plasma generated from the inert gas; and a third cleaning step of, after the second cleaning step, providing a gas containing a fluorine-containing gas and an oxygen-containing gas, and removing a silicon-containing deposition by plasma generated from the gas containing the fluorine-containing gas and the oxygen-containing gas.

According to one aspect, a method of cleaning capable of effectively removing multiple types of depositions is provided.

DETAILED DESCRIPTION OF THE PREFERRED EMBODIMENTS

Figure 1:
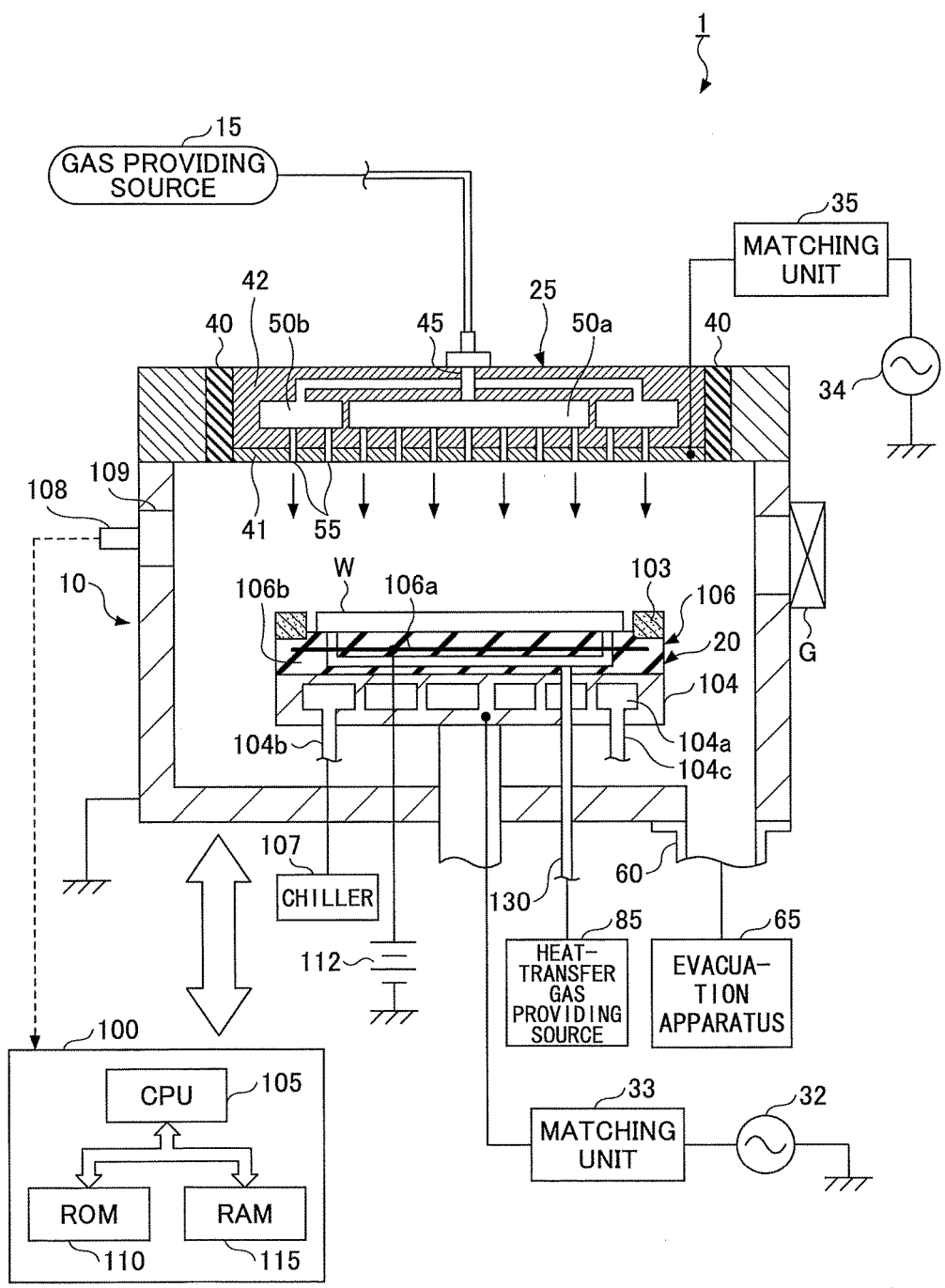
FIG. 1 is a view illustrating an example of a vertical section of an etching apparatus of an embodiment.

Hereinafter, the invention will be described with reference to illustrative embodiments. It is to be noted that, in the explanation of the drawings, the same components are given the same reference numerals, and explanations are not repeated.

(Overall Structure of Etching Apparatus)

First, an etching apparatus 1 of the embodiment is described with reference to FIG. 1. FIG. 1 illustrates an example of a vertical section of the etching apparatus 1 of the embodiment. The etching apparatus 1 of the embodiment is a parallel plate plasma processing apparatus (capacitively coupled plasma processing apparatus) in which a mounting table 20 and a gas shower head 25 are provided to face with each other in a process chamber 10. The mounting table 20 has a function to support a semiconductor wafer (hereinafter, simply referred to as a "wafer W".) and also functions as a lower electrode. The gas shower head 25 has a function to provide a gas in a shower form in the process chamber 10 and also functions as an upper electrode.

The process chamber 10 is made of, for example, aluminum whose surface is anodized (an anodic treatment is performed), and has a cylindrical shape. The process chamber 10 is electrically grounded. The mounting table 20 is provided at a bottom portion of the process chamber 10, and on which the wafer W is mounted. The wafer W is an example of a substrate to be etched, and a metal stacked film of an MRAM element is formed on the wafer W.

The mounting table 20 is formed by, for example, aluminum (Al), titanium (Ti), silicon carbide (SiC) or the like. An electrostatic chuck 106 is provided at an upper surface of the mounting table 20 for electrostatically adsorbing the substrate. The electrostatic chuck 106 has a structure in which a chuck electrode 106a is sandwiched in an insulator 106b.

A direct-current voltage source 112 is connected to the chuck electrode 106a, and direct current is provided from the direct-current voltage source 112 to the chuck electrode 106a. With this, the wafer W is adsorbed onto the electrostatic chuck 106 by Coulomb force.

A circular focus ring 103 is mounted on the electrostatic chuck 106 so as to surround a circumference portion of the wafer W. The focus ring 103 is made of a conductive component such as silicon, for example, and converges plasma toward a surface of the wafer W in the process chamber 10 to improve etching efficiency.

The mounting table 20 is supported by a support body 104. A coolant flow channel 104a is formed in the support body 104. A coolant inlet pipeline 104b and a coolant outlet pipeline 104c are connected to the coolant flow channel 104a. A coolant such as cooling water or brine, for example, output from a chiller 107 is circulated in the coolant inlet pipeline 104b, the coolant flow channel 104a and the coolant outlet pipeline 104c. With this, the mounting table 20 and the electrostatic chuck 106 are cooled.

A heat-transfer gas providing source 85 provides a heat-transfer gas such as a helium gas (He) or an argon gas (Ar) to a back surface of the wafer W on the electrostatic chuck 106 through a gas providing line 130. With such a structure, temperature of the electrostatic chuck 106 is controlled by the coolant circulated in the coolant flow channel 104a and the heat-transfer gas provided to the back surface of the wafer W. As a result, the substrate can be controlled to be predetermined temperature.

A first high frequency power source 34 is electrically connected to the gas shower head 25 via a matching unit 35. The first high frequency power source 34 applies high frequency electric power HF for plasma excitation of 60 MHz, for example, to the gas shower head 25. Here, although it is described that the high frequency electric power HF is applied to the gas shower head 25 in this embodiment, the high frequency electric power HF may be applied to the mounting table 20. A second high frequency power source 32 is electrically connected to the mounting table 20 via a matching unit 33. The second high frequency power source 32 applies high frequency electric power LF for bias of 13.56 MHz, for example, to the mounting table 20.

The matching unit 35 matches load impedance to internal (or output) impedance of the first high frequency power source 34. The matching unit 33 matches load impedance to an internal (or output) impedance of the second high frequency power source 32. The matching unit 35 and the matching unit 33 function to match, when plasma is generated in the process chamber 10, the internal impedance and the load impedance of the first high frequency power source 34 and the second high frequency power source 32, respectively, on appearance.

The gas shower head 25 includes a ceiling electrode plate 41 provided with a plurality of gas providing holes 55, and a cooling plate 42 that detachably supports the ceiling electrode plate 41. The gas shower head 25 is attached to close and block an opening of the ceiling portion of the process chamber 10 via a shield ring 40 that covers its circumference portion. A gas inlet 45 for introducing a gas is formed at the gas shower head 25. A diffusion room 50a at a center side and a diffusion room 50b at an edge side, branched from the gas inlet 45, are provided in the gas shower head 25. A gas output from a gas providing source 15 is provided to the diffusion rooms 50a, 50b via the gas inlet 45, and is diffused in each of the diffusion rooms 50a, 50b to be introduced from the plurality of gas providing holes 55 toward the mounting table 20.

An evacuation port 60 is provided at a bottom surface of the process chamber 10, and the process chamber 10 is evacuated by an evacuation apparatus 65 connected to the evacuation port 60. With this, the process chamber 10 is retained at predetermined vacuum. A gate valve G is provided at a sidewall of the process chamber 10. By opening and closing the gate valve G, the wafer W is carried in the process chamber 10 and carried out from the process chamber 10.

A luminescence sensor 108 is attached to the etching apparatus 1 that is capable of measuring an intensity of light of each wavelength in plasma in the process chamber 10 through a quartz window 109.

A control unit 100 that controls operations of the entirety of the apparatus is provided at the etching apparatus 1. The control unit 100 includes a Central Processing Unit (CPU) 105, a Read Only Memory (ROM) 110 and a Random Access Memory (RAM) 115. The CPU 105 executes desired processes such as an etching process and an antistatic process in accordance with various recipes stored in such a memory area. The recipes include control data of the apparatus for process conditions such as process time, pressure (evacuation of a gas), high frequency electric power or voltage, flow of various gases, temperature in the process chamber 10 (temperature of the upper electrode, temperature of the sidewall of the process chamber, temperature of the electrostatic chuck, and the like), temperature of the chiller 107 and the like. Here, these programs and recipes indicating process conditions may be stored in a hard disk or in a semiconductor memory. Further, the recipes may be set at a predetermined site of a memory area under a state being stored in a recording medium such as a CD-ROM or a DVD readable by a portable computer.

Further, the control unit 100 measures emission spectrum of each wavelength based on a detection value detected by the luminescence sensor 108, and detects an endpoint of each cleaning step, which will be described later.

When performing an etching process, open and close of the gate valve G is controlled, and the wafer W is carried in the process chamber 10 to be mounted on the mounting table 20. By providing direct current from the direct-current voltage source 112 to the chuck electrode 106a, the wafer W is adsorbed onto the electrostatic chuck 106 by Coulomb force and retained.

Next, an etching gas, the high frequency electric power HF for plasma excitation and the high frequency electric power LF for bias are provided in the process chamber 10, and plasma is generated. A plasma etching process is performed on the wafer W by the generated plasma.

After the etching process, electric charge on the wafer W is removed by applying direct-current voltage HV, whose positive-negative is opposite from that for adsorbing the wafer W, to the chuck electrode 106a from the direct-current voltage source 112, and the wafer W is released from the electrostatic chuck 106. Opening and closing of the gate valve G is controlled, and the wafer W is carried out from the process chamber 10.

(MRAM Element)

According to the etching apparatus 1 of the embodiment, by performing separated plurality of cleaning steps for cleaning after etching an MRAM element on the wafer W in order, reaction products containing a metal, carbon and silicon deposited in the process chamber 10 while etching can be efficiently removed.

Before describing a method of cleaning of the embodiment, an example of an MRAM element 2 is briefly described with reference to FIG. 2. The MRAM element is formed by a multilayer film including a metal stacked film. The metal stacked film may include, for example, cobalt (Co), iron (Fe), nickel (Ni), boron (B), palladium (Pd), platinum (Pt), manganese (Mn), zirconium (Zr), iridium (Ir), ruthenium (Ru), tantalum (Ta), chromium (Cr), magnesium (Mg), titanium (Ti), tungsten (W), aluminum (Al), copper (Cu), gold (Au), silver (Ag) or the like. Further, the metal stacked film may include oxide or nitride including either of the above described metals.

Figure 2:
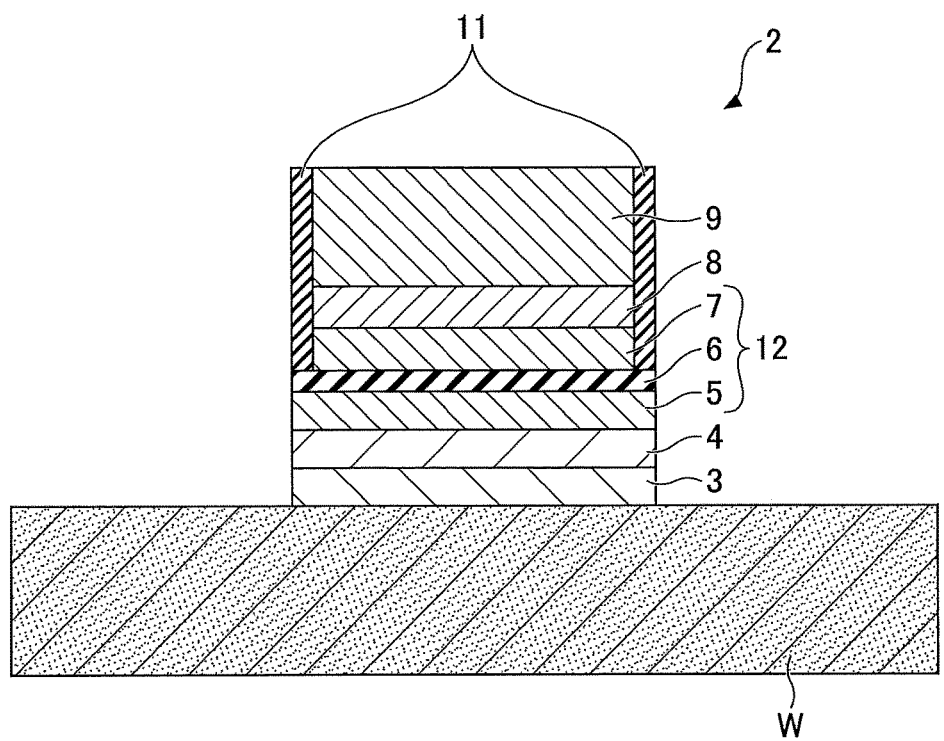
FIG. 2 is a view illustrating an example of a MRAM element of the embodiment.

FIG. 2 illustrates an example of a cross-section of the MRAM element 2. The MRAM element 2 is provided on the silicon wafer W, and includes a lower electrode layer 3, a pinning layer 4, a second magnetic layer 5, an insulating layer 6, a first magnetic layer 7, an upper electrode layer 8 and a mask 9 stacked in this order from a lower side. A protection film 11 is provided at sidewalls of the first magnetic layer 7, the upper electrode layer 8 and the mask 9 of the MRAM element 2. In the following, a stacked film of the second magnetic layer 5, the insulating layer 6 and the first magnetic layer 7 is referred to as a "metal stacked film 12" as well.

The lower electrode layer 3 is an electrode component having an electric conductivity formed on the substrate. The thickness of the lower electrode layer 3 is, for example, approximately 5 nm. The pinning layer 4 is provided between the lower electrode layer 3 and the second magnetic layer 5. The pinning layer 4 fixes a direction of magnetization of the lower electrode layer 3 by a pinning effect of an antiferromagnetic material. As the pinning layer 4, for example, an antiferromagnetic material such as IrMn (iridium manganese) or PtMn (platinum manganese) may be used, and its thickness is, for example, approximately 7 nm. The second magnetic layer 5 is provided on the pinning layer 4 and includes a ferromagnetic material. The second magnetic layer 5 functions as a so-called pinned layer in which a direction of magnetization is retained constant without being effected by an external magnetic field by the pinning effect of the pinning layer 4. As the second magnetic layer 5, CoFeB is used, and its thickness is, for example, approximately 2.5 nm.

The insulating layer 6 is sandwiched between the second magnetic layer 5 and the first magnetic layer 7, and forms a Magnetic Tunnel Junction (MTJ). In the Magnetic Tunnel Junction (MTJ), as the insulating layer 6 is interposed between the second magnetic layer 5 and the first magnetic layer 7, a tunnel magnetoresistance (TMR) effect is generated between the second magnetic layer 5 and the first magnetic layer 7. In other words, an electrical resistance that corresponds to a relative relationship (parallel or antiparallel) between a direction of magnetization of the second magnetic layer 5 and a direction of magnetization of the first magnetic layer 7 is generated between the second magnetic layer 5 and the first magnetic layer 7. As the insulating layer 6, $Al_2O_3$ or MgO is used, and its thickness is, for example, 1.3 nm.

The first magnetic layer 7 is provided on the insulating layer 6 and includes a ferromagnetic material. The first magnetic layer 7 functions as a so-called free layer whose direction of magnetization follows an external magnetic field which is magnetic information. As the first magnetic layer 7, CoFeB is used, and its thickness is, for example, approximately 2.5 nm.

The upper electrode layer 8 is an electrode component having an electric conductivity formed on the first magnetic layer 7. The thickness of the upper electrode layer 8 is, for example, approximately 5 nm. The mask 9 is formed on the upper electrode layer 8. The mask 9 is formed to have a shape corresponding to a planar shape of the MRAM element 2. As the mask 9, for example, Ta, TiN, $SiO_2$, W, Ti or the like is used, and it thickness is, for example, 50 nm.

Figure 3:
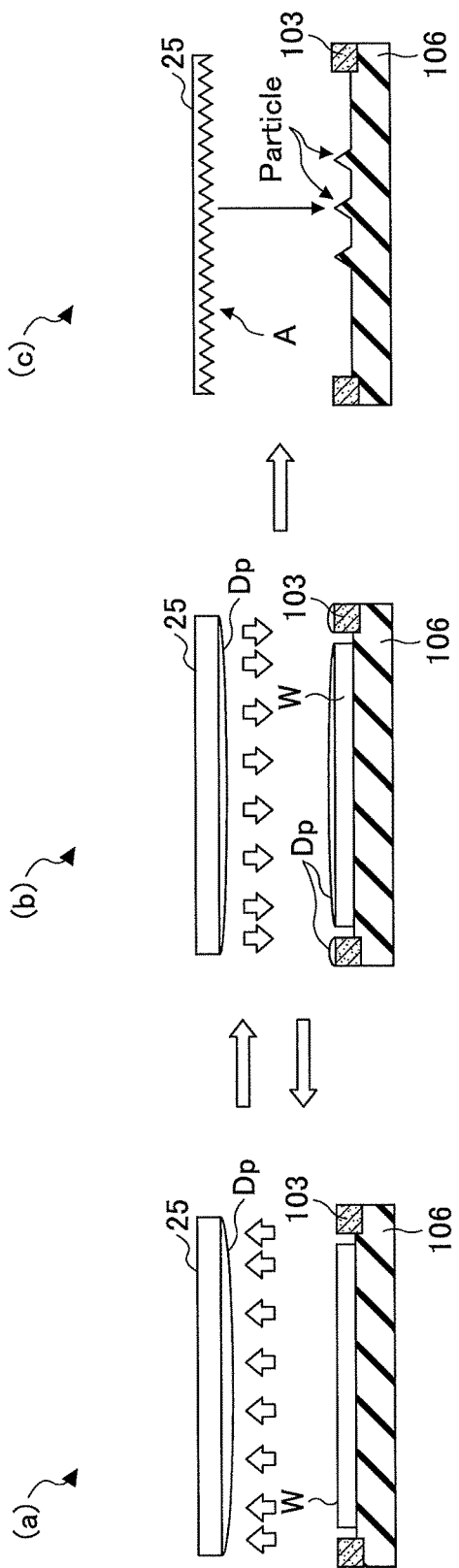
FIG. 3 is a view illustrating an example of generation of particles.

When etching the MRAM element 2, different types of depositions such as a deposition of a metal such as magnesium (Mg) included in the metal film, a deposition of carbon (C) generated from a reaction product or the like of a carbon-containing gas which is used as an etching gas of the MRAM element 2, and a deposition of silicon (Si) that is generated due to etching of the silicon wafer W, which is an underlayer of the metal film, parts in the process chamber including silicon or the like. As illustrated in (a) of FIG. 3, these depositions Dp adhere a ceiling surface of the gas shower head 25. As illustrated in (b) of FIG. 3, a part of the depositions Dp is stripped from the ceiling surface when its thickness becomes greater than or equal to a predetermined value or the like, and fallen on the wafer W or on the focus ring 103 and deposited thereon. With this, a portion where the depositions Dp are remained to be adhered and a portion where the depositions Dp are stripped are generated at the ceiling surface of the gas shower head 25, and the portion where the depositions Dp are stripped is chipped by spattering during cleaning or etching so that banded concavo-convex portions, for example, are formed at the ceiling portion. As a result, as illustrated in (c) of FIG. 3, a ceiling surface A becomes like a micro mask, and is fallen on the wafer W as a particle as large as approximately 100 micron, for example, which is larger than normal.

If a metal-containing deposition, a carbon-containing deposition and a silicon-containing deposition are cleaned by a same gas, a part of the depositions cannot be removed and remained in the process chamber, which causes variation of an etching rate, or generation of particles.

Thus, according to the method of cleaning of the embodiment, the metal-containing deposition, the carbon-containing deposition and the silicon-containing deposition are removed in different and separated cleaning steps using plasmas generated from specific gasses appropriate for respective depositions, respectively. With this, components of the metal-containing deposition, the carbon-containing deposition and the silicon-containing deposition can be separately removed, and an etching rate can be stabilized, generation of particles can be suppressed, and lifetime of the parts can be lengthened, in a longtime operation.

(Method of Cleaning)

Figure 4:
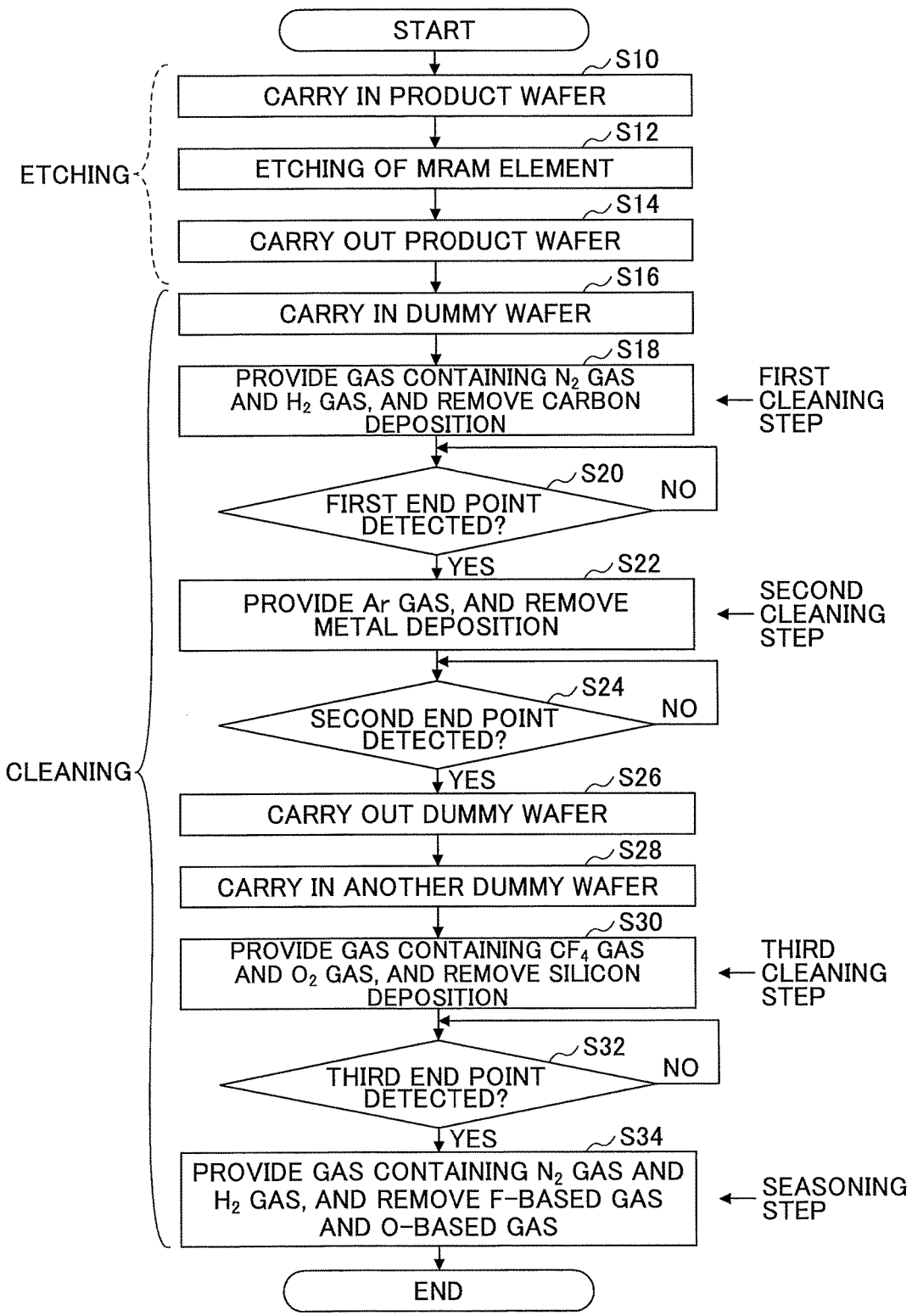
FIG. 4 is a flowchart illustrating an example of a cleaning process of the embodiment.

The method of cleaning of the embodiment is described with reference to a flowchart of FIG. 4. As a precondition, an MRAM is etched in steps S10 to S14, before the present cleaning. Specifically, a product wafer W is carried in in step S10, plasma etching is performed on the wafer W by an etching gas containing a hydrocarbon gas in step S12; and the wafer W after being etched is carried out in step S14. The method of cleaning of the embodiment is used for cleaning of the etching apparatus 1 after etching is performed on one or a plurality of product wafers W is performed.

(First Cleaning Step: Removal of Carbon-Containing Deposition)

In the cleaning step, first, in step S16, a dummy wafer is carried in. Next, in step S18, a gas containing a nitrogen ($N_2$) gas and a hydrogen ($H_2$) gas is provided in the process chamber 10, and plasma whose main constituent is the nitrogen gas and the hydrogen gas is generated. The carbon-containing deposition can be removed by, mainly, a function of a hydrogen radical in the generated plasma. Here, this step is an example of a first cleaning step of providing a gas containing a hydrogen-containing gas, and removing a carbon-containing deposition by plasma generated from the gas containing the hydrogen-containing gas.

In the first cleaning step, a gas containing a hydrogen-containing gas and a nitrogen containing gas may be provided. For example, in the first cleaning step, a nitrogen gas, a hydrogen gas and an argon gas (Ar) may be provided. However, in the first cleaning step, a gas containing an oxygen ($O_2$) gas and a fluorine (F) gas is not provided. This is to prevent the metal-containing deposition, which will be removed in the next step, from being oxidized and fluoridized by the gas containing the oxygen gas and the fluorine gas.

Figure 5:
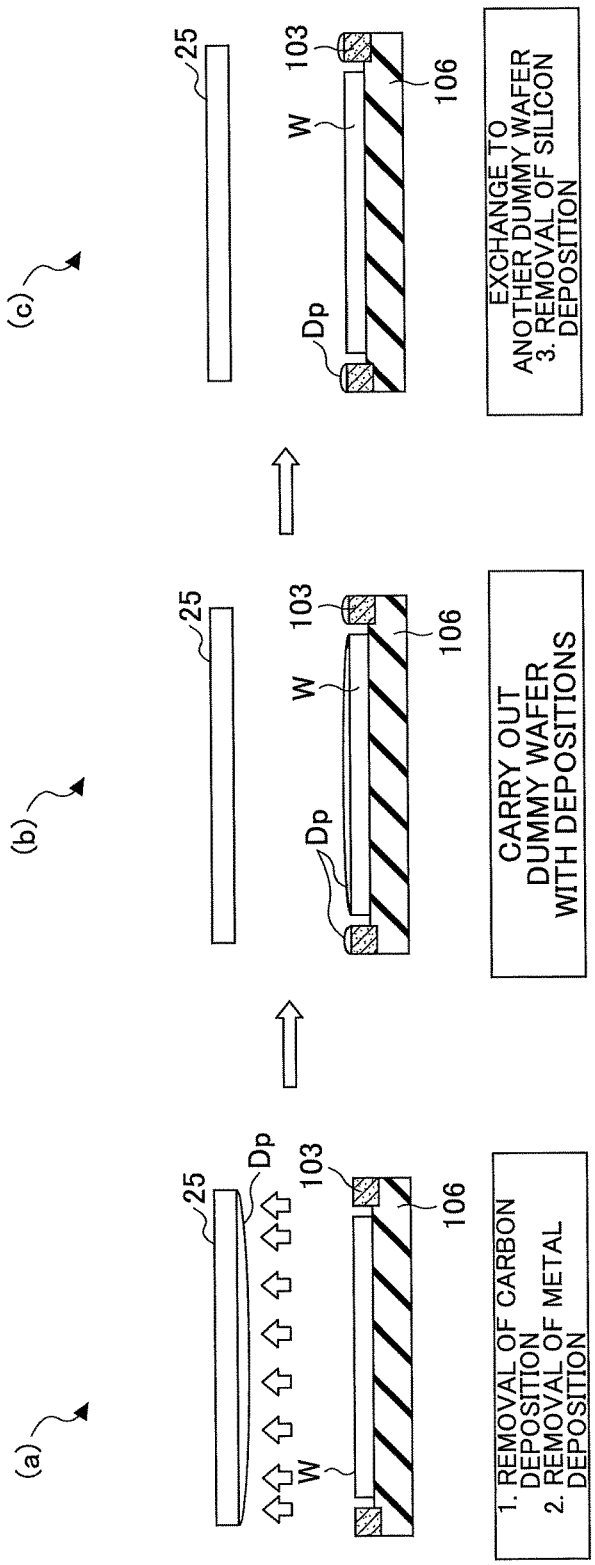
FIG. 5 is a view for describing cleaning and suppression of generation of particles of the embodiment.

In the first cleaning step, in order to completely perform "1. removal of carbon-containing deposition" illustrated in (a) of FIG. 5, the control unit 100 controls to proceed to a next cleaning step after a first endpoint is detected, by measuring an emission intensity of CN (carbon nitride) at 387 nm based on a detection value of the luminescence sensor 108.

Figure 6:
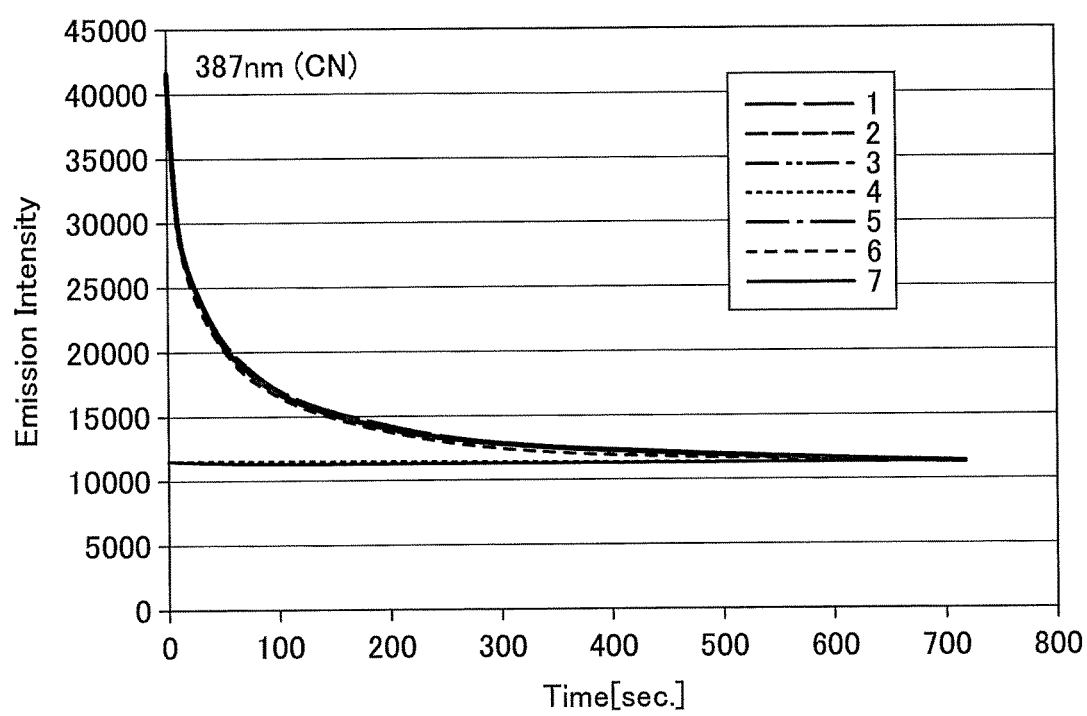
FIG. 6 is a view illustrating an example of an endpoint detection result of a first cleaning step of the embodiment.

An endpoint detection (EPD) is performed by measuring an intensity of light at each wavelength in the plasma using the luminescence sensor 108 attached to the etching apparatus 1. The control unit 100 detects an emission intensity of carbon nitride (387 nm), that is generated when the carbon-containing deposition and a nitrogen component included in the plasma react with each other, from a measured emission spectrum of the plasma in the process chamber 10. The control unit 100 determines that the first endpoint is detected when a gradient of the emission intensity of carbon nitride with respect to time becomes zero (0). For example, FIG. 6 illustrates results of the first endpoint detection for seven dummy wafers. In a graph of FIG. 6, a horizontal axis expresses time, and a vertical axis expresses an emission intensity of carbon nitride (387 nm). When a gradient of the emission intensity of carbon nitride (387 nm) with respect to time becomes almost zero, it can be determined that hardly any carbon-containing deposition exists in the process chamber 10.

As such, according to the control unit 100 of the embodiment, by determining that the first endpoint is detected when the gradient of the emission intensity of carbon nitride with respect to the time becomes almost zero, cleaning time can be optimized to be time by which the carbon-containing deposition can be actually almost completely removed. With this, the process can be moved to the next second cleaning step after almost completely removing the carbon-containing deposition.

(Second Cleaning Step: Removal of Metal-containing Deposition)

Referring back to FIG. 4, when the control unit 100 detects the first endpoint in step S20, the process proceeds to step S22, and the second cleaning step is performed. In the second cleaning step, an argon gas is provided in the process chamber 10, and the metal-containing deposition is beaten out by, mainly, a function of sputtering of ions of in plasma of the argon gas, and is removed to outside of the process chamber 10. Here, this step is an example of a second cleaning step of, after the first cleaning step, providing an inert gas, and removing a metal-containing deposition by plasma generated from the inert gas.

Although the argon gas is provided as the gas of the second cleaning step in this embodiment, the gas provided in the second cleaning step is not limited so, and other inert gases such as helium (He), krypton (Kr) or xenon (Xe) may be used. Here, a gas containing an oxygen gas and a fluorine gas is not provided in the second cleaning step. This is to prevent the metal-containing deposition from being oxidized and fluoridized by the gas containing the oxygen gas and the fluorine gas.

In the second cleaning step, the control unit 100 detects an emission intensity of the metal-containing deposition sputtered by the plasma of the argon gas from the emission spectrum of the plasma in the process chamber 10 measured by the luminescence sensor 108. The metal-containing deposition to be measured may include platinum (Pt), magnesium (Mg), tantalum (Ta), cobalt (Co) and ruthenium (Ru). The metal-containing deposition to be measured my include at least either of cobalt (Co), iron (Fe), boron (B), palladium (Pd), platinum (Pt), manganese (Mn), iridium (Ir), ruthenium (Ru), magnesium (Mg), titanium (Ti) and tungsten (W) included in the MRAM element 2 and tantalum (Ta) of the underlayer film. Here, a deposition of tantalum is generated when an underlayer film made of tantalum (Ta) included in the MRAM element 2 is over-etched, for example.

Figure 7:
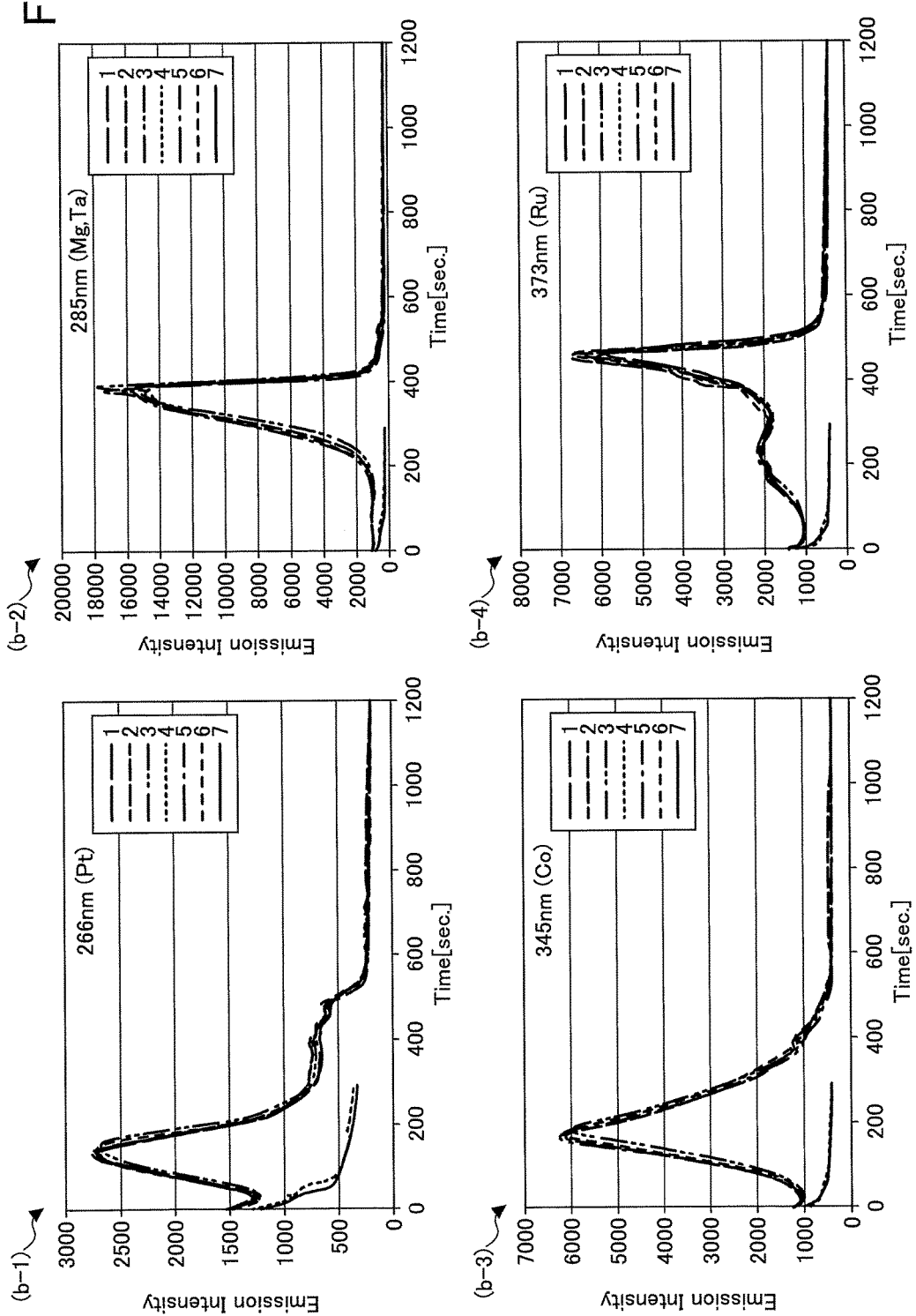
FIG. 7 is a view illustrating an example of an endpoint detection result of a second cleaning step of the embodiment.

The control unit 100 determines that the second endpoint is detected when a gradient of the emission intensity of these metal-containing depositions with respect to time becomes zero (0). FIG. 7 illustrates results of the second endpoint detection for seven dummy wafers. For example, targets for the second endpoint detection of FIG. 7 are, platinum (Pt) at 266 nm of (b-1), magnesium (Mg) and tantalum (Ta) at 285 nm of (b-2), cobalt (Co) at 345 nm of (b-3), and ruthenium (Ru) at 373 nm of (b-4), of FIG. 7. When a gradient of the emission intensity of each of the metals with respect to time becomes almost zero, it can be determined that hardly any metal-containing depositions exist in the process chamber 10.

As such, according to the control unit 100 of the embodiment, by determining that the second endpoint is detected when the gradient of the emission intensity of each of the metals with respect to the time becomes almost zero, cleaning time can be optimized to be time by which the metal-containing deposition can be actually almost completely removed. With this, the process can be moved to the next third cleaning step after almost completely removing the metal-containing depositions.

Referring back to FIG. 4, when the control unit 100 detects the second endpoint in step S24, the dummy wafer is carried out in step S26, and another dummy wafer is carried in in step S28. With this, as illustrated in (b) of FIG. 5, reaction products of the carbon or the metals fallen from the ceiling portion and deposited on the dummy wafer by sputtering particularly during the second cleaning step can be rapidly ejected to outside of the process chamber. Thereafter, the next third, cleaning step for performing removal of the silicon-containing deposition such as $SiO_2$ or SiC as illustrated in (c) of FIG. 5 is started. However, an exchanging process of the dummy wafers of steps S26 and S28 may be omitted. Further, a process of carrying in the new dummy wafer in step S28, after performing carrying out of the dummy wafer in step S26 is performed, may be omitted.

(Third Cleaning Step: Removal of Silicon-containing Deposition)

Referring back to FIG. 4, the process proceeds to step S30, and the third cleaning step is performed. In the third cleaning step, a gas containing a carbon tetrafluoride ($CF_4$) gas and an oxygen gas is provided in the process chamber 10, and plasma whose main constituent is the carbon tetrafluoride gas and the oxygen gas is generated. The silicon (including a silicon oxide film) deposition is removed by, mainly, a function of a fluorine-based radical in the generated plasma. Here, this step is an example of a third cleaning step of, after the second cleaning step, providing a gas containing a fluorine-containing gas and an oxygen-containing gas, and removing a silicon-containing deposition by plasma generated from the gas containing the fluorine-containing gas and the oxygen-containing gas.

In the third cleaning step, as another example of the fluorine-containing gas, a fluorine gas ($F_2$), a nitrogen trifluoride gas ($NF_3$) or a sulfur hexafluoride gas ($SF_6$) may be provided. Further, an inert gas may be provided with the fluorine-containing gas and the oxygen-containing gas.

Figure 8:
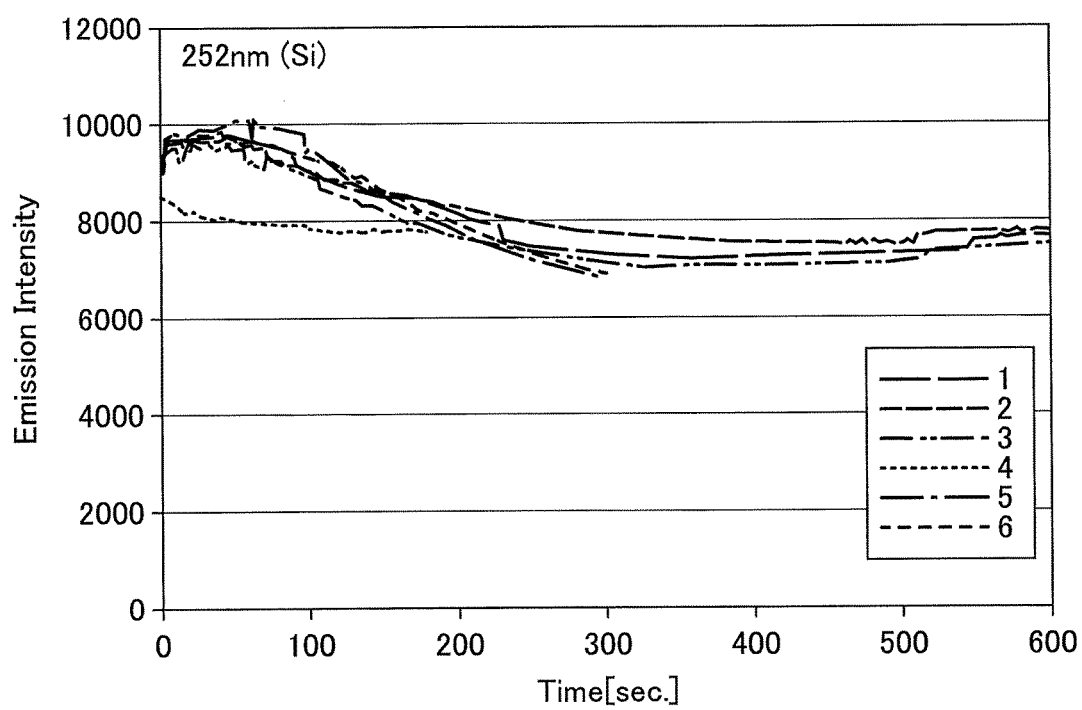
FIG. 8 is a view illustrating an example of an endpoint detection result of a third cleaning step of the embodiment.

In the third cleaning step, in order to almost completely perform "3. removal of silicon-containing deposition" illustrated in (c) of FIG. 5, the control unit 100 measures an emission intensity of silicon and detects a third endpoint. For example, FIG. 8 illustrates results of the third endpoint detection for seven dummy wafers. The control unit 100 determines that the third endpoint is detected when a gradient of the emission intensity of silicon with respect to time becomes zero (0). By performing the third endpoint detection for every third cleaning step, the cleaning time can be optimized to be time by which the silicon-containing deposition is actually almost completely removed. With this, the silicon-containing deposition can be completely removed.

(Seasoning Step: Atmosphere in Process Chamber is Adjusted)

Referring back to FIG. 4, when the control unit 100 detects the third endpoint in step S32, the process proceeds to step S34, and the fluorine-containing gas and the oxygen-containing gas generated in the third cleaning step are removed from the process chamber by providing a gas containing a nitrogen gas and a hydrogen gas (seasoning step). With this, atmosphere in the process chamber is adjusted, and the process is finished.

In the seasoning step, a gas containing the hydrogen-containing gas may be provided. For example, in the seasoning step, a nitrogen gas, a hydrogen gas and an argon gas (Ar) may be provided. Further, as long as the hydrogen-containing gas is contained in the gas to be provided, the nitrogen containing gas may not be contained. Here, this step is an example of a fourth cleaning step of, after the third cleaning step, providing a gas containing a hydrogen-containing gas, and removing a fluorine-containing gas and an oxygen-containing gas by plasma generated from the gas containing the hydrogen-containing gas.

Figure 9:
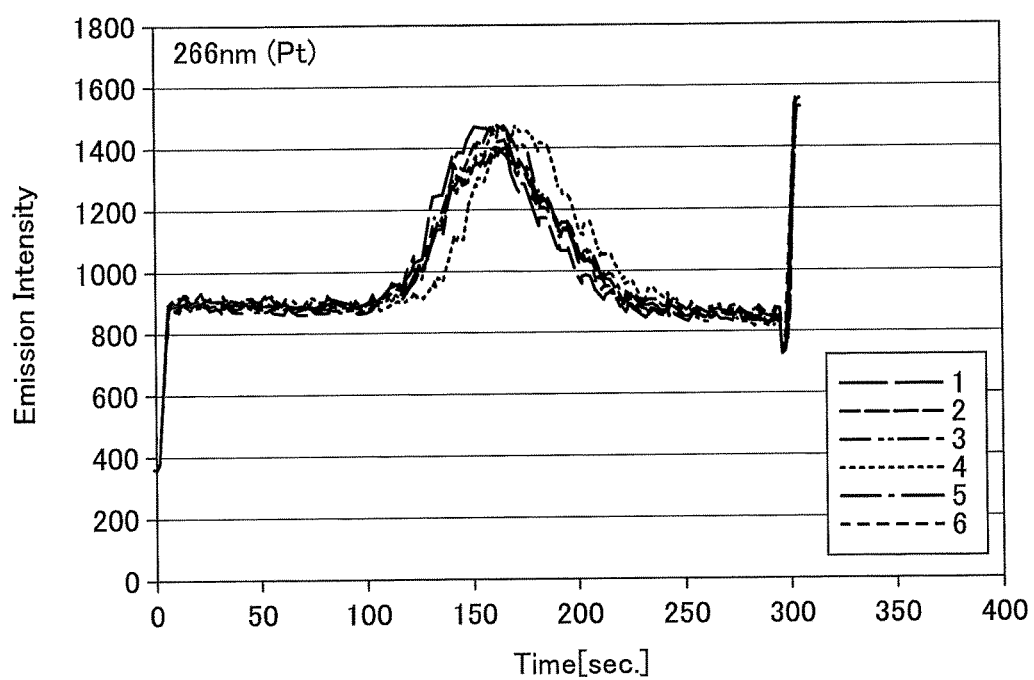
FIG. 9 is a view illustrating an example of a result of prevention of variation of an etching rate by the cleaning of the embodiment.

FIG. 9 illustrates an example of a result of performing etching of the MRAM element 2 in the etching apparatus 1 after performing the cleaning and the seasoning by the method of cleaning of the embodiment. FIG. 9 illustrates variation of an emission spectrum of plasma of platinum (Pt: 266 nm) in etching the MRAM element 2 with respect to time. FIG. 9 illustrates that there is no variation in peaks of, the emission spectrums in etching of seven product wafers, in other words, there is no variation in time necessary for etching the platinum layer (Pt) of the MRAM element 2 for the seven product wafers. With this, it can be confirmed that variation of an etching rate can be prevented by the method of cleaning of the embodiment.

Figure 10:
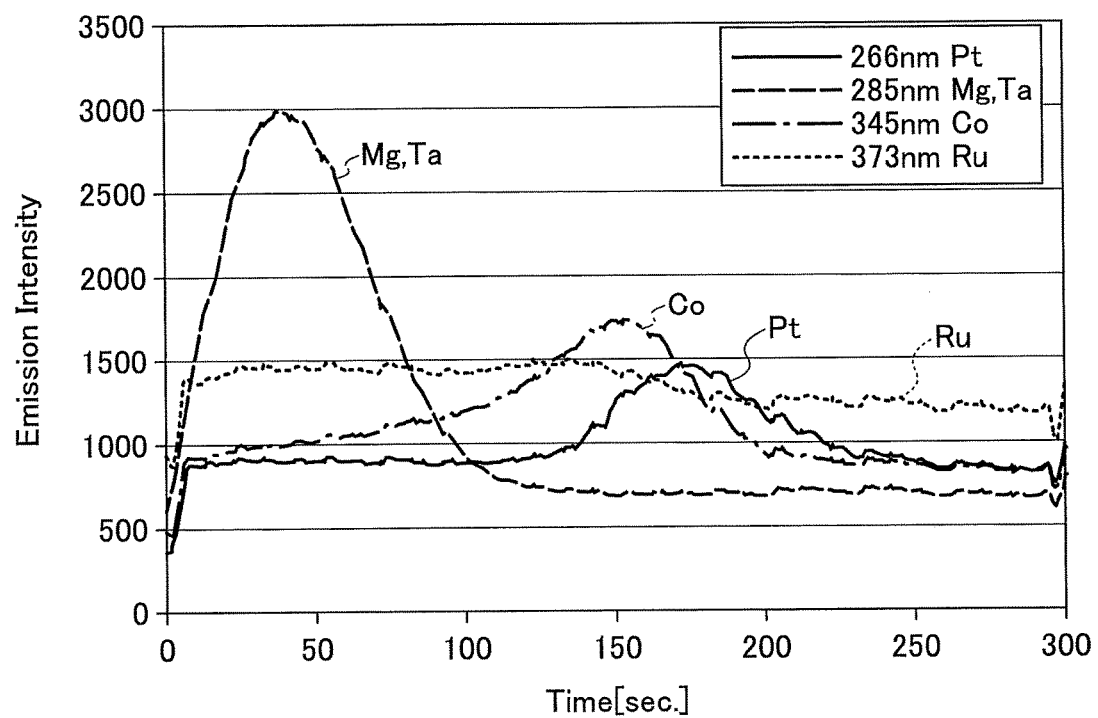
FIG. 10 is a view illustrating an example of a measurement result of an emission during etching and cleaning of the embodiment.
Figure 11:
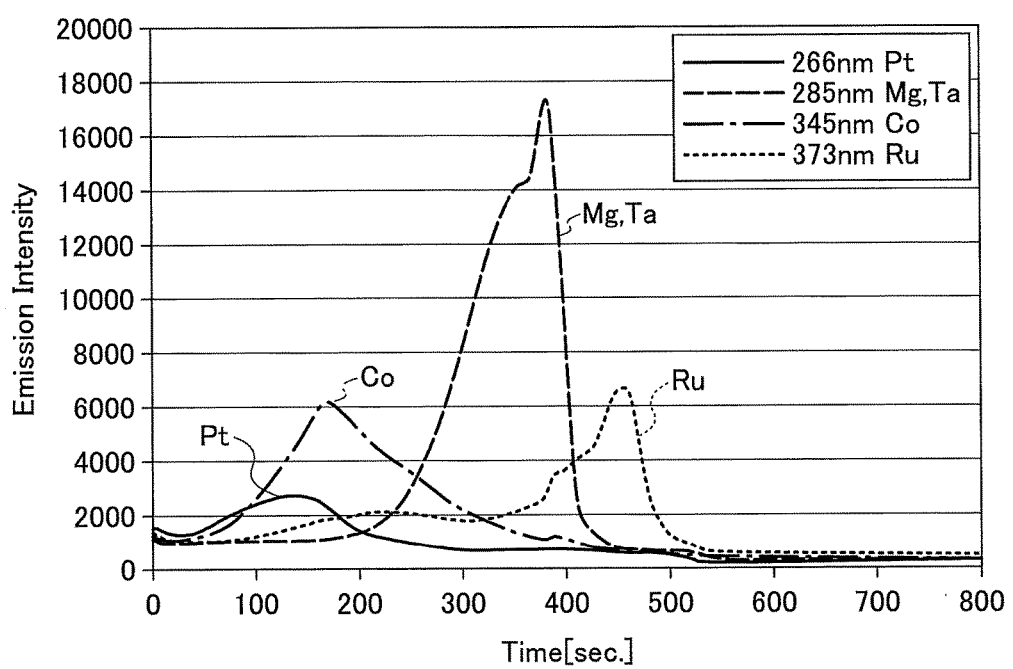
FIG. 11 is a view illustrating an example of a measurement result of an emission intensity during etching and cleaning of the embodiment.

Here, although etching of the platinum layer (Pt) is targeted in FIG. 9, it can be easily predicted that there is no variation in time necessary for etching even when measuring emission spectrums of another metal layer of the MRAM element 2. FIG. 10 illustrates an example of an emission spectrum measured when etching the MRAM element 2. FIG. 11 illustrates an example of an emission spectrum measured when cleaning the MRAM element 2. With this, an order of peaks of the emission spectrums generated after etching is started is, as illustrated in FIG. 10, ruthenium (Ru)→magnesium (Mg) and tantalum (Ta)→cobalt (Co)→platinum (Pt), in this order.

On the other hand, an order of peaks of the emission spectrums generated after cleaning is started is opposite of the order in etching, and as illustrated in FIG. 11, platinum (Pt)→cobalt (Co)→magnesium (Mg) and tantalum (Ta) →ruthenium (Ru), in this order. Thus, it can be understood that the most newly deposited deposition in etching is removed first in cleaning.

As described above, according to the method of cleaning of the embodiment, a specific gas is provided for each cleaning step, and cleaning is performed by specific plasma. Further, endpoint detection is performed for each cleaning step based on emission spectrum. With this, multiple different types of stacked films generated in etching can be removed in order.

Here, for the endpoint detection, a gas mass spectrometer or a secondary ion mass spectrometer (SIMS) may be used, or an analyzer having an ion detection principle same as those spectrometers may be used.

As described above, according to the method of cleaning of the embodiment, the carbon, the metal and the silicon-containing depositions in the process chamber 10 after etching the metal film of the MRAM element can be efficiently removed. With this, a generation of a micro mask due to residues of a metal component and a carbon component on parts in the process chamber can be eliminated, roughness of surfaces of the parts can be stabled, generation of particles can be efficiently suppressed, and lifetime of the parts can be extended. Further, according to the method of cleaning of the embodiment, the carbon, the metal and the silicon components can be efficiently removed by providing steps of separately cleaning by different cleaning gases, after etching one or a plurality of product wafers. Thus, the etching rate is not varied and a stable etching condition can be retained in a longtime operation.

Further, as the control unit 100 performs the endpoint detection based on the emission spectrum, an optimum value of the cleaning time can be calculated in accordance with a detection value of the luminescence sensor 108. With this, the cleaning times can be automatically controlled based on times of the first to third endpoint detections, respectively.

Figure 12:
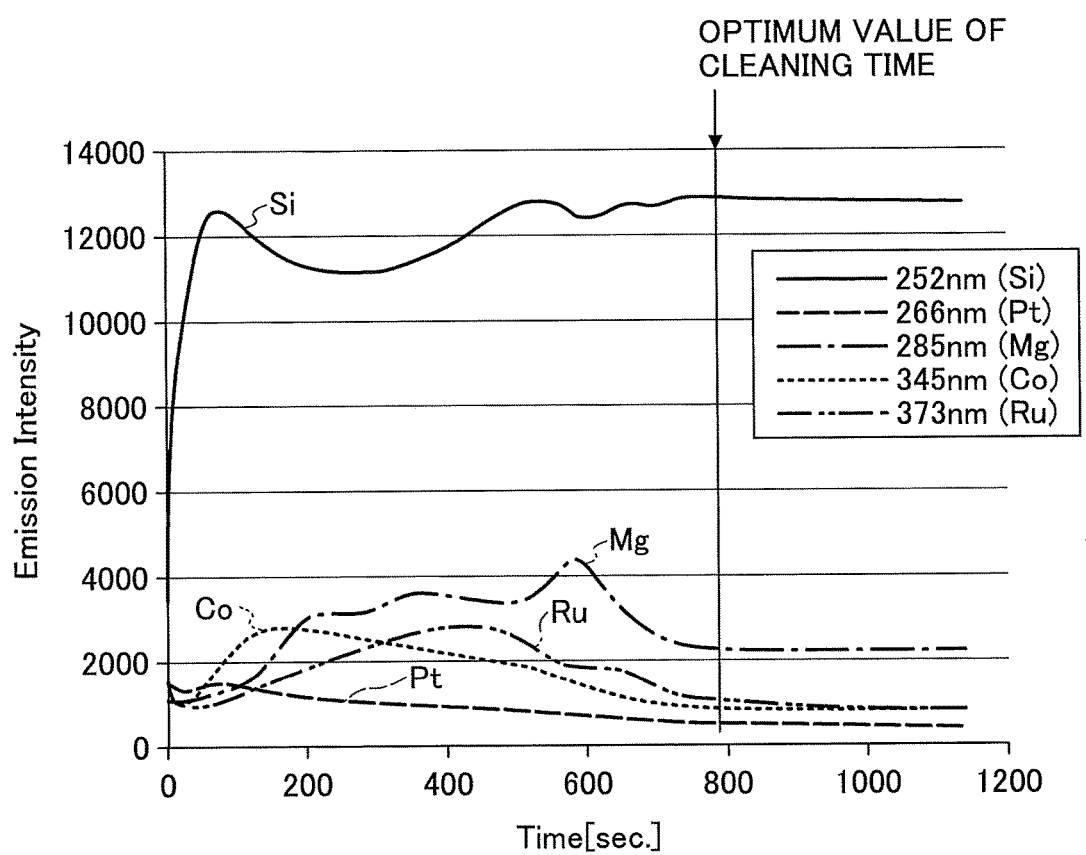
FIG. 12 is a view illustrating an example of an optimum value of cleaning time of the embodiment.

Optimization of the cleaning time is briefly described with reference to FIG. 12. In FIG. 12, an example of emission spectrums of silicon (Si: 252 nm), platinum (Pt: 266 nm), magnesium (Mg: 285 nm), cobalt (Co: 345 nm) and ruthenium (Ru: 373 nm) is illustrated. In this example, the control unit 100 calculates 800 seconds as an optimum value of the cleaning time by which gradients of the emission intensities of silicon and all of the above described metals with respect to time become almost zero, and controls the cleaning times in the second and the third cleaning steps as 800 seconds. With this, the cleaning time can be automatically controlled.

Although a preferred embodiment of a method of cleaning and a method of plasma processing in which plasma processing including the method of cleaning is performed has been specifically illustrated and described, it is to be understood that modifications may be made therein without departing from the spirit and scope of the invention as defined by the claims. The descriptions of the plurality of embodiments may be selectably combined within a compatible range.

For example, although it is described in the above embodiment a method of cleaning the inside of the process chamber of the etching apparatus 1 in which the MRAM of the film including a metal where the insulating layer is interposed between the first magnetic layer and the second magnetic layer is etched. However, a film to be etched is not limited to the MRAM, and may be a multilayer film material including a film containing a metal or a metal film.

Further, the first to fourth cleaning steps (including the seasoning step) are performed in the method of cleaning of the embodiment. However, the method of cleaning of the invention is not limited to this, and only the first and the second cleaning steps may be performed, and the third and the fourth cleaning steps may not be performed.

In such a case, a method of cleaning is performed including a first cleaning step of cleaning a carbon-containing deposition by plasma generated from a gas containing a hydrogen-containing gas, and a second cleaning step of, after the first cleaning step, providing an inert gas, and cleaning a metal-containing deposition by plasma generated from the inert gas. In the first cleaning step, the carbon-containing deposition is removed by, mainly, a chemical action of a hydrogen radical in the plasma. Next, in the second cleaning step, the metal-containing deposition is physically beaten out by, mainly, sputtering of argon ions in the plasma, and is removed to outside of the process chamber 10. As such, different types of depositions can be almost completely removed in order, and with this, variation of an etching rate and generation of particles can be prevented, and lifetime of parts can be extended.

The etching apparatus of the embodiment is an example of a substrate processing apparatus of the invention. As the substrate processing apparatus of the invention, not only a Capacitively Coupled Plasma (CCP) apparatus, but another substrate processing apparatus may be applicable. As the other substrate processing apparatus, an Inductively Coupled Plasma (ICP) apparatus, a plasma processing apparatus using a radial line slot antenna, a Helicon Wave Plasma (HWP) apparatus, an Electron Cyclotron Resonance Plasma (ECR) apparatus and the like may be exemplified.

Further, a substrate processed by the substrate processing apparatus of the invention is not limited to the wafer, and for example, a large-size substrate for a Flat Panel Display, or a substrate for an EL element or for a solar cell may be exemplified.

Here, as an example of the carbon-containing gas used as the etching gas of the MRAM element 2, although methane ($CH_4$), ethylene ($C_2H_4$), carbon tetrafluoride ($CF_4$), carbonyl fluoride ($COF_2$), carbon monoxide (CO), methanol ($CH_3OH$), ethanol ($C_2H_5OH$), acetylacetone ($C_5H_8O_2$), hexafluoro acetylacetone ($C_5H_2F_6O_2$), acetic acid ($CH_3COOH$), pyridine ($C_5H_5N$), formic acid (HCOOH) and/or the like may be exemplified, this is not limited so.

The present application is based on and claims the benefit of priority of Japanese Priority Application No. 2015-098867 filed on May 14, 2015, the entire contents of which are hereby incorporated by reference.

NUMERALS

1: etching apparatus
2: MRAM element
3: lower electrode layer
4: pinning layer
5: second magnetic layer
6: insulating layer
7: first magnetic layer
8: upper electrode layer
9: mask
10: process chamber
12: metal stacked film
15: gas providing source
20: mounting table
25: gas shower head
32: second high frequency power source
34: first high frequency power source
100: control unit
103: focus ring
106: electrostatic chuck
108: luminescence sensor
Dp: deposition
W: silicon substrate

What is claimed is:

1. A method of cleaning a substrate processing apparatus that etches a film including a metal, the method comprising:
   a first cleaning step of providing a gas containing a hydrogen-containing gas, and removing a carbon-containing deposition by plasma generated from the gas containing the hydrogen-containing gas;
   a second cleaning step of, after the first cleaning step, providing an inert gas, and removing a metal-containing deposition by plasma generated from the inert gas; and
   a third cleaning step of, after the second cleaning step, providing a gas containing a fluorine-containing gas and an oxygen-containing gas, and removing a silicon-containing deposition by plasma generated from the gas containing the fluorine-containing gas and the oxygen-containing gas.

2. The method of cleaning according to claim 1, further comprising:
   a fourth cleaning step of, after the third cleaning step, providing a gas containing a hydrogen-containing gas, and removing the fluorine-containing gas and the oxygen-containing gas by plasma generated from the gas containing the hydrogen-containing gas.

3. The method of cleaning according to claim 2, wherein the fourth cleaning step is stated after a third endpoint is detected based on an emission intensity of Si in the third cleaning step.

4. The method of cleaning according to claim 1, wherein the second cleaning step is started after a first endpoint is detected based on an emission intensity of CN in the first cleaning step.

5. The method of cleaning according to claim 1, wherein the third cleaning step is started after a second endpoint is detected based on an emission intensity of at least either of Pt, Mg, Ta, Co and Ru in the second cleaning step.

6. The method of cleaning according to claim 1, wherein cleaning time is automatically controlled based on time of detecting a first endpoint based on an emission intensity of CN performed in the first cleaning step, time of detecting a second endpoint based on an emission intensity of at least either of Pt, Mg, Ta, Co and Ru, and time of detecting a third endpoint based on an emission intensity of Si performed in the third cleaning step.

7. The method of cleaning according to claim 1, wherein a dummy wafer is carried in before the first cleaning step, and the dummy wafer is carried out and a new dummy wafer is carried in after the second cleaning step.

8. A method of plasma processing, comprising:
   a step of etching a film including a metal by an etching gas in a substrate processing apparatus;
   a first cleaning step of providing a gas containing a hydrogen-containing gas in the substrate processing apparatus, and removing a carbon-containing deposition by plasma generated from the gas containing the hydrogen-containing gas;
   a second cleaning step of, after the first cleaning step, providing an inert gas in the substrate processing apparatus, and removing a metal-containing deposition by plasma generated from the inert gas; and
   a third cleaning step of, after the second cleaning step, providing a gas containing a fluorine-containing gas and an oxygen-containing gas in the substrate processing apparatus, and removing a silicon-containing deposition by plasma generated from the gas containing the fluorine-containing gas and the oxygen-containing gas.

* * * * *